United States Patent [19]

Hollander et al.

[11] 4,133,700
[45] Jan. 9, 1979

[54] COLD JUNCTION THERMOCOUPLE COMPENSATOR

[75] Inventors: Betty R. Hollander; William E. McKinley, Stamford, both of Conn.

[73] Assignee: Omega Engineering Inc., Stamford, Conn.

[21] Appl. No.: 862,879

[22] Filed: Dec. 21, 1977

Related U.S. Application Data

[63] Continuation of Ser. No. 665,582, Mar. 10, 1976, abandoned.

[30] Foreign Application Priority Data

Mar. 13, 1975 [GB] United Kingdom ............... 10478/75

[51] Int. Cl.$^2$ ............................................. H01L 35/28
[52] U.S. Cl. ........................................ 73/361; 73/341;
136/242; 136/222; 340/515
[58] Field of Search ................ 136/222, 242; 324/105;
73/341, 361; 340/227 D, 228 R

[56] References Cited

U.S. PATENT DOCUMENTS

| | | | |
|---|---|---|---|
| 1,205,325 | 11/1916 | Clark | 136/222 X |
| 1,228,678 | 6/1917 | Johnson | 136/222 X |
| 1,411,033 | 3/1922 | Jensen | 136/222 X |
| 3,225,597 | 12/1965 | Engelhard | 73/361 |
| 3,650,154 | 3/1972 | Arnett et al. | 73/361 |
| 3,916,691 | 11/1975 | Hollander et al. | 73/361 |

FOREIGN PATENT DOCUMENTS 691809 8/1964 Canada ............................. 73/361

OTHER PUBLICATIONS

Product Bulletin 803-A, Omega Engineering, Inc., 4 pages.
Catalog No. C021, Consolidated Omega Devices, Inc., 6 pages.
Avasthy, "Cold Junction Compensation for Thermocouple Sensors, Jul. 1973, pp. 211 to 212, Institution of Engineers (India), vol. 53, pt. 6.

*Primary Examiner*—Leland A. Sebastian
*Attorney, Agent, or Firm*—William Anthony Drucker

[57] ABSTRACT

A cold junction compensator provides the electrical equivalent of an ice-bath reference thermocouple, at a selected temperature, for example 0° C. Input connectors, for engagement with conventional thermocouple units, form thermocouple junctions with conductors connected to a battery-operated Wheatstone bridge circuit adapted to supply an equal and opposite voltage output compensating for variations in the thermocouple junction output at different ambient temperatures. The compensator may be included in a module having input sockets or input plugs to coact with plugs or sockets of conventional thermocouple units. The compensator and battery may be encapsulated, or an accessible switch may be included in the battery circuit.

1 Claim, 4 Drawing Figures

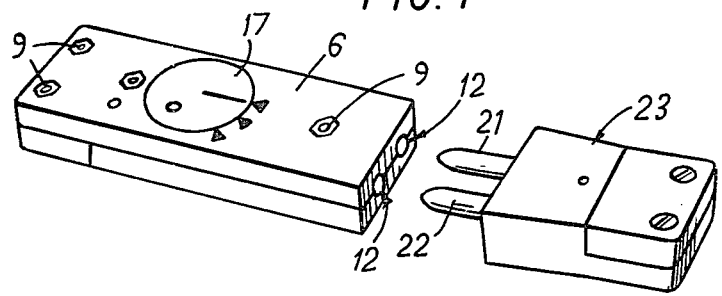
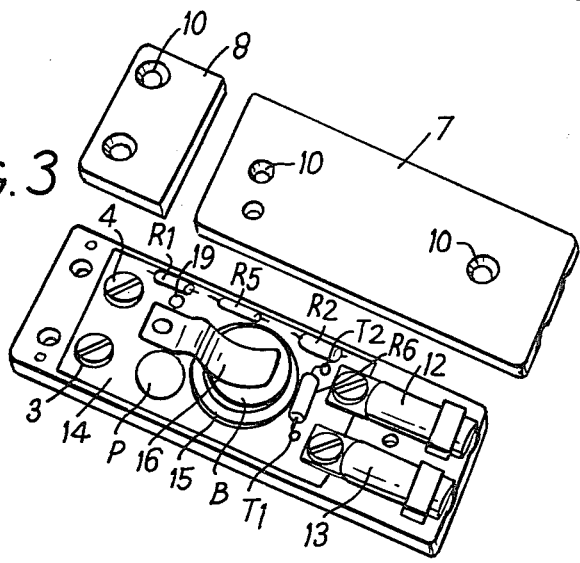
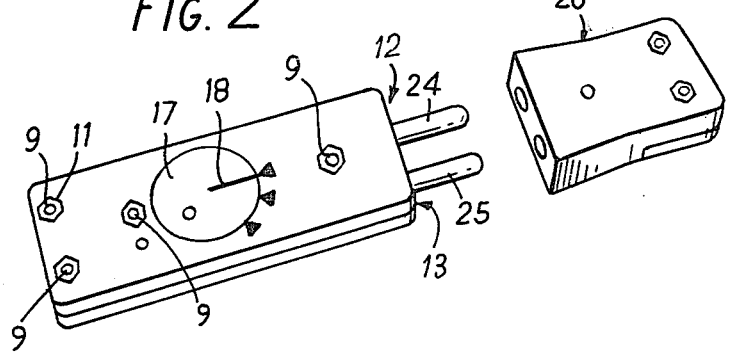

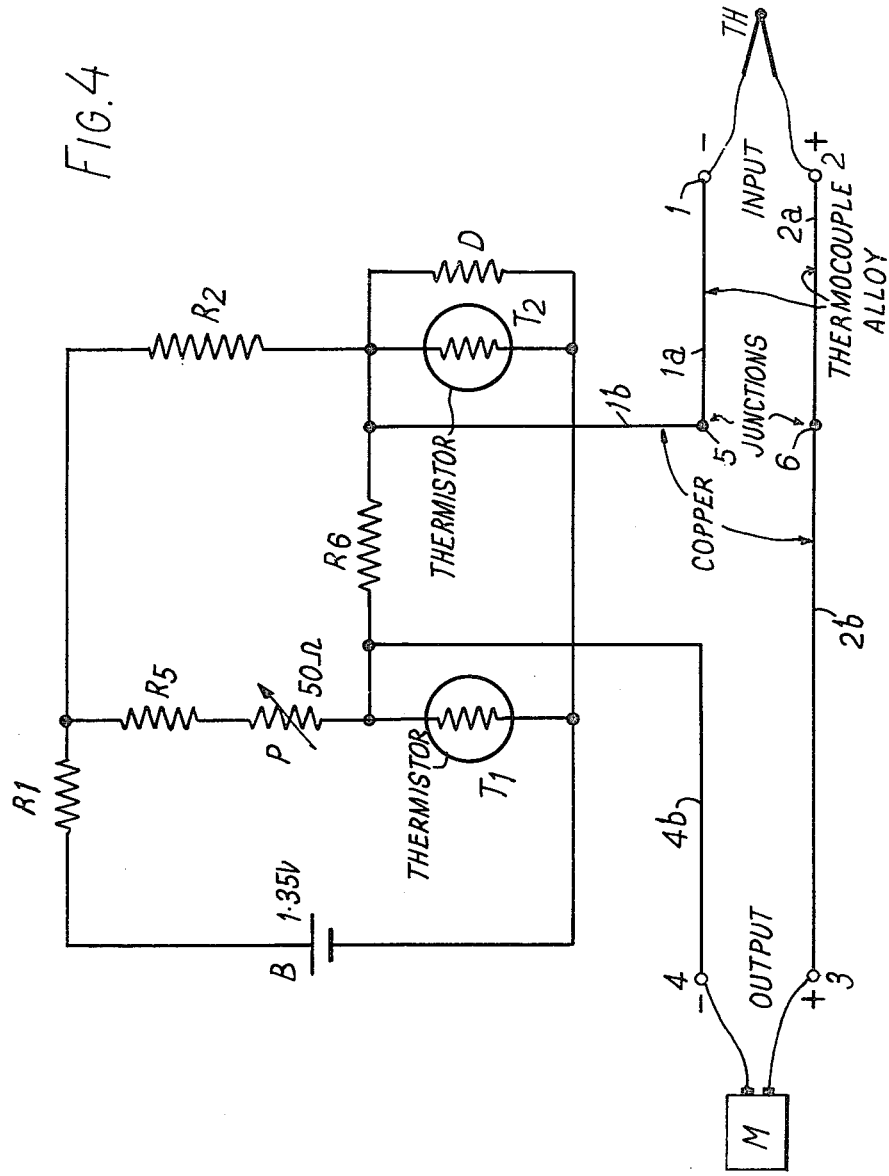

COLD JUNCTION THERMOCOUPLE COMPENSATOR

This is a continuation of Ser. No. 665,582 filed 10th Mar. 1976, now abandoned.

This invention relates to a cold junction compensator for use in thermocouple circuits.

BACKGROUND OF THE INVENTION

In thermocouple circuits it is necessary, for certain measurements, to utilise two identical thermocouples and, whilst keeping one at a reference temperature, to use the other to sense the temperature of an environment to be investigated. Under laboratory conditions, the temperature of the first thermocouple is usually maintained at ice point (0° C) by use of an ice bath, or at some higher fixed temperature by means of a temperature-controlled oven, and the first thermocouple is usually known as the reference or "cold junction". The other thermocouple is inserted in the environment under investigation and is known as the "sensing junction" or "hot junction". The known conventional methods for maintaining the first temperature-controlled junction at a constant temperature are satisfactory for use under laboratory conditions, but are impractical in terms of weight, size, cost, power consumption, maintenance, warm-up time, and ice replacement or contamination, in many industrial applications, and especially in aircraft and missile applications.

OBJECTS OF THE INVENTION

It is the main object of the present invention to provide a cold junction compensator, for use in thermocouple circuits, which provides the physical and electrical equivalent of an icebath reference thermocouple at 0° C.

Another object of the invention is to provide an extremely versatile cold junction compensator which is not larger than a conventional quick-disconnect thermocouple connector and which is readily portable.

A still further object of the invention is to provide a cold junction compensator which can operate on a replaceable button-type self-contained mercury battery.

SUMMARY OF THE INVENTION

According to the present invention, a cold junction compensator comprises:

(i) a first input connector for connection to a first element of a sensing thermocouple, said first connector being made of one material of a thermocouple junction;
(ii) a second input connector for connection to a second element of said sensing thermocouple, said second connector being made of said one material of a thermocouple junction;
(iii) a first conductor forming a thermocouple junction with said first connector;
(iv) a second conductor forming a thermocouple junction with said first connector;
(v) first and second output terminals;
(vi) an electrical connection between said first conductor and said first output terminal;
(vii) a voltage generator circuit between said second conductor and said second output terminal, said generating circuit being constructed such that, over a range of temperature, the voltage generated at any temperature is equal and opposite to the voltage differential generated by said thermocouple junctions at that temperature.

In a preferred form, the voltage generating circuit is a Wheatstone bridge circuit including a supply battery, one arm including resistance elements whose value varies with variation of temperature, such as for example Thermistors.

Conveniently, the compensator is incorporated in a module in which the input connectors form or are incorporated in plugs or sockets for use respectively with a conventional female or male plug connector thermocouple unit.

An important advantage may be gained in the invention by computer selection of resistors for the bridge circuit, to match the characteristics of a closely-matched pair of Thermistors which have the same or approximately the same temperature-resistance curve, say within 0.2° C interchangeability, or most preferably within 0.1° C interchangeability.

A further advantageous feature of the invention is the possibility of substitution of the resistor portions of the circuit, e.g. by plugging in alternative units, to permit the same matched pair of Thermistors to be used for different circuits and metal-metal combinations.

A still further advantageous feature of the invention is the possibility of substitution of the Thermistor portion of the circuit, as well as or alternatively to the substitution of the resistor portion of the circuit.

The power supply for the voltage generating circuit is conveniently obtained from a primary battery, and at least the battery and circuit may be encapsulated. Alternatively, switch means may be included in the battery circuit.

The above and other objects, features and advantages will be apparent from the following description of an embodiment of cold junction compensator with reference to the accompanying drawings.

BRIEF DESCRIPTION OF THE DRAWINGS

FIG. 1 is a perspective elevation showing a cold-junction compensator module with sockets adapted to receive the pins of a male connector;

FIG. 2 is a perspective elevation showing a compensator module arranged having male pins for engagement in a female connector;

FIG. 3 is a perspective view of a compensator module, with cover portions shown separated, and with pins omitted;

FIG. 4 is a circuit diagram of the internal components and connections of the compensator of any of FIGS. 1, 2 and 3.

DESCRIPTION OF THE PREFERRED EMBODIMENT

Referring firstly to FIG. 4, the unit has terminals 1 and 2 for receiving the input from a sensing thermocouple TH. Conductors 1a and 2a are both made of the same thermocouple alloy, and conductors 1b and 2b are both made of copper. Conductor 2a connects terminal 2 to a thermocouple junction $J_6$, and conductor 2b connects junction $J_6$ directly to an output terminal 3 of a pair of output terminals 3, 4 connected to a measuring instrument or recorder M. Conductor 1a connects terminal 1 to a thermocouple junction $J_5$, and conductor 1b connects junction $J_5$ to a bridge circuit. Conductor 4b, of copper, connects the bridge circuit to output terminal 4. Thermocouple junctions $J_5$ and $J_6$ are formed between the thermocouple alloy conductors 1a and 2a and the copper conductors 1b and 2b.

One arm of the bridge is constituted by resistors $R_2$, $R_5$ and variable resistor P in series, and the other arm of the bridge is constituted by two Thermistors $T_1$ and $T_2$ and shunt resistor $D_1$. A resistor $R_6$ is connected centrally across the bridge, and provides an output to conductors 1b and 4b. A battery B is connected in series with resistor $R_1$ to the ends of the bridge.

Values of the resistors $R_1$, $R_2$, $R_5$, $R_6$, and D are shown in the following table for various thermocouple pairs:

Thermistors $T_1$ and $T_2$ = (e.g. YS1 44031or YS1 44006) 10k at 25° C, or any equivalent Thermistor pair having the same temperature or resistance characteristics.

| Resistor | Iron v/s Constantan | Chromel v/s Alumel | Platinum v/s Platinum Alloy | Chromel v/s Constantan | Copper v/s Constantan |
|---|---|---|---|---|---|
| $R_1$ | 15k | 15k | 150k | 15k | 15k |
| $R_2$ | 110 | 57.6 | 95.3 | 68.1 | 61.9 |
| $R_5$ | 1.105k | 565.1 | 1.409k | 693.5 | 626.4 |
| $R_6$ | 150 | 124 | 174 | 200 | 124 |
| D | 3.74k | 3.83k | 2.5k | 3.65k | 3.65k |

B is a single cell battery, such as a "Mallory" PX625.
P is a variable resistor — 50 ohms.

The system incorporates two temperature sensitive elements (Thermistors) which are thermally integrated with the cold junctions 5 and 6. The circuit is energized from the battery B. The output voltage across resistor $R_6$ is proportional to the unbalance created between a pre-set equivalent electronic reference temperature and the temperature of a hot junction. In this system, the referenc temperature 0° C may be chosen.

Since the cold junctions are subjected to ambient temperature, a thermally generated voltage is produced therein. This voltage would appear as an error voltage unless compensated for. This is accomplished by automatically injecting into the circuit an equal and opposite voltage. This cancels the error voltage and maintains the electrical equivalent of a static reference junction temperature over a wide range of ambient temperature, with a high degree of accuracy. By integrating the copper leads with the cold junctions, the thermocouple material itself is not connected to the input terminal of the measurement device M, thereby eliminating secondary errors.

The circuit is a bridge for the Thermistor pair $T_1$, $T_2$ and the proper corresponding resistors, as given in the table herein, have been selected by computer read-out to give a nearly smooth temperature-resistance curve. The pair of Thermistors $T_1$, $T_2$ are preferably selected to be as nearly identical as possible, and the resistors should be selected to be within 2% and preferably within 1%, of the values listed in the table.

Referring now to FIGS. 1 to 3, the module has a body 6 with a major cover 7 and a minor cover 8 adapted to be retained in position on the body 6 by metal screws 9 inserted in holes 10 and engaged in nuts 11. At one end of the body 6 there are provided two input sockets 12, 13 corresponding respectively to terminals 1 to 2 (see FIG. 4) and respectively connected to the input conductors 1a and 2a. At the other end of the body 6 are provided screw terminals 3, 4 corresponding to output terminals 3 and 4 of FIG. 4. Intermediately, the body receives a removable board 14 of insulating material on which are mounted the resistors $R_1$, $R_2$, $R_5$, $R_6$ and D, and the variable resistor P. A matched pair of Thermistors $T_1$, $T_2$ can be used for different circuits and combinations of metals by modular substitution of the resistor parts of the circuit by plugging in alternative units. In the board 14 there is provided a well 15 to accommodate the battery B retained by a spring contact 16. On the outer face of the body 6 there is provided a rotatably removable cover 17 for the batter B, and this also serves as a supply switch and may have, for example, three positions indicated by an index 18 and giving conditions of "off", "open", and "on". The switch is not shown in the circuit of FIG. 4, and it could be omitted and the unit left energised for the normal running life of the cell, say 2000 hours or more. It would be included in the circuit of FIG. 4 in the connection to either pole of the battery B.

The device may be placed in the energised state and then encapsulated, being intended to be discarded after the useful life of the battery has terminated.

A battery test light 19 can be utilised by inserting a point such as a pencil point through an aperture of the cover 17 to place the test light in parallel with the battery to show the state of the battery.

The input sockets 12 and 13 can serve as the sockets of a conventional male-female plug connection, e.g. as in the form shown in FIG. 1 wherein the sockets are adapted to receive the pins 21, 22 of a conventional male thermocouple plug 23.

The sockets 12 and 13 can also receive removable pins 24 and 25, as shown in FIG. 2, such that the module then has male pins 24 and 25 for insertion into the sockets of a conventional female thermocouple jack 26. The pins 24 and 25 are advantageously of different diameters, and of different metals.

In a practical construction, the module body 6 could have dimensions as follows:
Length 3 inches
Width 1 inch
Thickness ½ inch
Weight, with battery, approx. 2 oz.

The entire cold junction module can plug into any conventional thermocouple panel board or male quick-disconnect, or female quick disconnect with the use of pins 24 and 25. It can be made highly stable, i.e. with a stability better than ±1° C at any temperature over a range of ± 10° C to ± 50° C. Its output terminals can be connected to meters, records, or potentiometers with ordinary copper leads. The small "button" type battery, e.g. Mallory PX625, can give over 2500 hours of continuous operation. The circuit components do not require any warm-up time.

The module may advantageously be colour-coded in standard manner for the pair of metal thermocouple elements it is designed to operate with.

We claim:
1. A cold junction compensator module comprising:
  (i) an elongated housing having a first end and a second end and including a body portion;
  (ii) a cold junction compensator circuit mounted on said body portion and including:
    (a) a first input connector for connection to a first element of a sensing thermocouple, said first element being made of one material of a thermocouple junction, said first input connector being mounted at said first end of said body portion,
    (b) a second input connector for connection to a second element of said sensing thermocouple, said second connector being made of said one material of said thermocouple junction, said second input connector being mounted at said first end of said body portion,
(c) a first copper conductor forming a thermocouple junction with said first connector,
(d) a second copper conductor forming a thermocouple with said second connector,
(e) first and second output terminals, mounted at said second end of said body portion,
(f) an electrical connection between said first conductor and said first output terminal,
(g) a Wheatstone bridge circuit including a supply battery, an arm of said bridge being constituted by matched Thermistors disposed in mutually balancing positions, said bridge circuit being arranged such that, over a range of temperature, it generates a voltage which at any temperature is equal and opposite to the voltage differential generated by said thermocouple junctions at that temperature, said bridge circuit being connected between said second conductor and said second output terminal,
(iii) a major cover extending from said first end of said body portion over a major part of the length of said body portion, said body portion and said major cover being apertured at said first end such that with said major cover secured on said body portion said input terminals are accessible from the exterior of the module,
(iv) a minor cover extending from said second end over a minor part of the length of said body portion, said minor cover covering said output terminals and preventing access thereto from the exterior of the module.

* * * * *